United States Patent [19]

Prulhiere

[11] Patent Number: 4,692,692

[45] Date of Patent: Sep. 8, 1987

[54] ELECTRONIC APPARATUS FOR DETECTING STRAY VARIATIONS IN AN ELECTRICAL VOLTAGE AS A FUNCTION OF TIME

[75] Inventor: Jean-Paul Prulhiere, Chambray-les-Tours, France

[73] Assignee: Commissariat a l'Energie Atomique, Paris, France

[21] Appl. No.: 784,119

[22] Filed: Oct. 4, 1985

[30] Foreign Application Priority Data

Oct. 5, 1984 [FR] France ................................ 84 15300

[51] Int. Cl.[1] ............................................ G08B 21/00
[52] U.S. Cl. ................................ 324/102; 324/103 P; 340/658
[58] Field of Search ............... 324/102, 103 P, 103 R, 324/127, 129, 78 C, 79 D; 340/661, 662, 658; 901/35, 46; 307/362, 518; 328/129.1, 146–149; 318/568; 364/468, 574

[56] References Cited

U.S. PATENT DOCUMENTS

| | | | |
|---|---|---|---|
| 3,453,540 | 7/1969 | Dusheck, Jr. | 324/103 P |
| 3,805,169 | 4/1974 | Hayokawa et al. | 901/46 |
| 3,870,941 | 3/1975 | Ikenga et al. | 901/46 |
| 3,999,124 | 12/1976 | Haney | 340/661 |
| 4,017,724 | 4/1977 | Finger | 340/661 |
| 4,263,583 | 4/1981 | Wyckoff | 340/661 |
| 4,287,769 | 9/1981 | Buckley | 901/46 |
| 4,330,777 | 5/1982 | McDuff | 340/661 |
| 4,415,853 | 11/1983 | Fisher | 324/103 R |
| 4,447,697 | 5/1984 | Dunne et al. | 901/46 |
| 4,499,419 | 2/1985 | Bockett-Pugh | 324/102 |
| 4,531,792 | 7/1985 | Cook | 901/46 |

FOREIGN PATENT DOCUMENTS

| | | | |
|---|---|---|---|
| 0074098 | 6/1980 | Japan | 324/103 R |
| 0913335 | 3/1982 | U.S.S.R. | 901/46 |

OTHER PUBLICATIONS

"Computer Controlled Robot with Ultrasonic Sensor", by Affinito et al, IBM Tech. Disc. Bull., vol. 18, #8, 1/76, pp. 2665–2667.

Primary Examiner—Reinhard J. Eisenzopf
Assistant Examiner—W. Burns
Attorney, Agent, or Firm—Kerkam, Stowell, Kondracki & Clarke

[57] ABSTRACT

An electronic apparatus is proposed for detecting variations of significance in an electrical voltage as a function of time. The apparatus includes a tracker (2) of these variations, a comparator (6) comparing the voltage with a reference voltage $V_2$, and a counting circuit (10, 15, 20). The tracker (2) monitors variations in the voltage supplied to a filtering and rectification system (4), which eliminates the continuous component of the signal and within the high frequency range greatly diminishes the levels of the parasitic signals having an oscillatory character. The comparator (6) furnishes a calibrated pulse (25) each time the voltage exceeds the threshold $V_2$, and the counting circuit (10, 15, 20) counts the number of these calibrated pulses within a given time period T and furnishes a logic signal (30) if this number exceeds a predetermined quantity.

11 Claims, 2 Drawing Figures

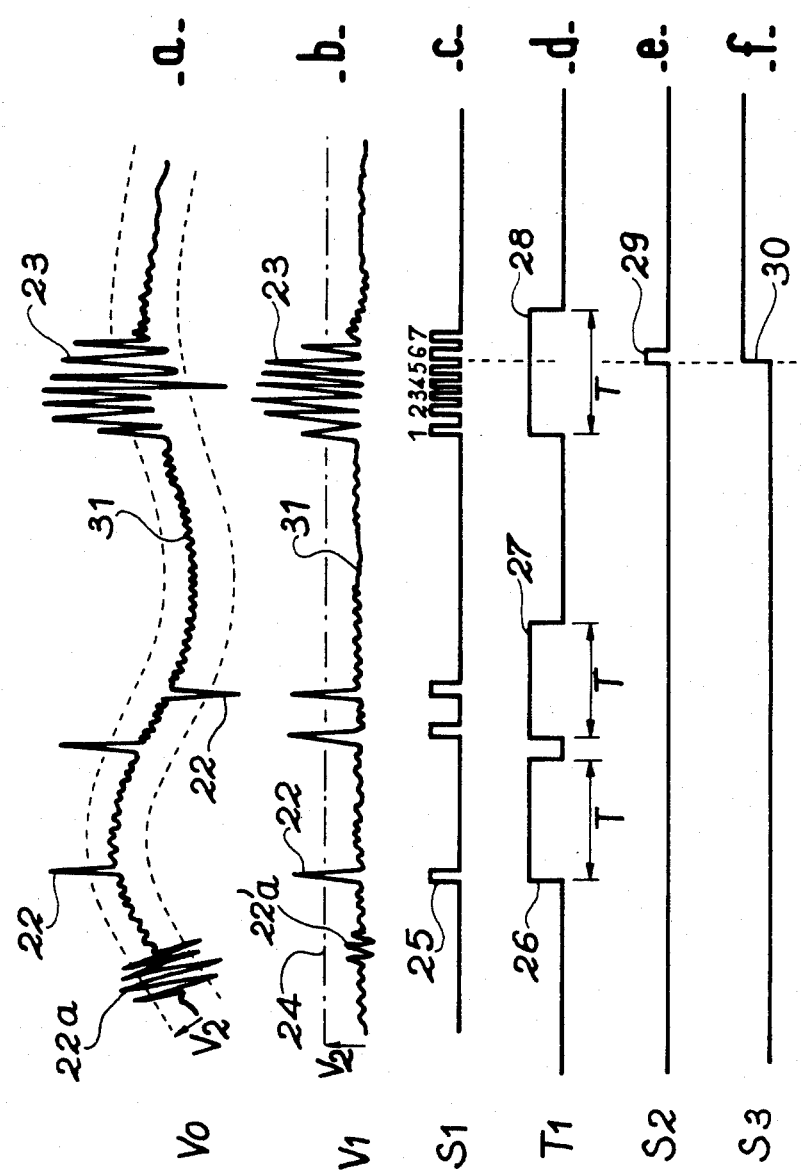

ELECTRONIC APPARATUS FOR DETECTING STRAY VARIATIONS IN AN ELECTRICAL VOLTAGE AS A FUNCTION OF TIME

FIELD OF THE INVENTION

The present invention relates to the examination of electrical signals which are variable with time, and more particularly to detecting stray, localized variations in an electrical voltage which is variable with time.

BACKGROUND OF THE INVENTION

In particular, but in a non-limiting manner, the invention relates to monitoring signals emitted by certain tracers used in robot systems for checking the dimensions of metal parts of various shapes. It relates especially and quite directly to zero-contact-pressure tracers or feelers, that is, those in which there is no physical contact with the part to be checked, such as the tracer for which French patent application No. 80 25457 was filed on Dec. 1, 1981 by the Commissariat à l'Energie Atomique [French Atomic Energy Commission].

The electrical signal emitted by a tracer of this type is a direct current or alternating current voltage which at certain instants can vary rapidly about its nominal value and can exhibit significant phenomena which need to be reliably detected in the presence of the influence of stray electricity which may be present.

In particular, the electrical voltage established in robot systems between a tracer and the part to be tested undergoes rapid high frequency variations when the tracer approaches quite near the position of contact with the part. These variations, in turn, translate into major variations in the electrical field between the tracer and the part, which are characteristic of the approach toward the part; it is these variations that need to be precisely and reliably detected by isolating them, especially from any background or stray noise.

SUMMARY OF THE INVENTION

Accordingly, the subject of the present invention is an electronic apparatus for detecting stray variations in an electrical voltage as a function of time, which is especially adapted for solving the above-addressed problem.

This apparatus is characterized in that it includes the following:

a tracker of the variations in this voltage supplying a filtering and rectification system which eliminates the continuous component of the signal and greatly diminishes the levels, in the high frequency range, of the stray signals having an oscillatory nature;

a comparator of this voltage, which has thus been filtered and rectified, with a reference step voltage $V_2$, the comparator furnishing a calibrated pulse each time this voltage exceeds the threshold voltage $V_2$; and a circuit which counts the number of these calibrated pulsed within a given time period T, the counting circuit furnishing a logic signal if this number exceeds a predetermined quantity.

According to a particularly important embodiment of the present invention, the electronic detection apparatus includes a counting circuit which comprises an AND gate, which at its two inputs receives the signal of the comparator output and the signal constituting a measurement window of time duration T, respectively, and the output of which is applied to a counter which, upon reaching a count of N, outputs a signal to a bistable multivibrator, which changes its state when the electrical voltage to be monitored exhibits stray variations.

The invention will be better understood from the ensuing description of a non-limiting exemplary embodiment of the invention, taken in conjunction with the drawings.

BRIEF DESCRIPTION OF THE DRAWINGS

FIG. 2, in its various parts 2a, 2b, 2c, 2d, 2e and 2f, shows the evolution, as a function of time, of the signals which are present at various points of the apparatus of FIG. 1.

DESCRIPTION OF THE PREFERRED EMBODIMENT

Figure 1:
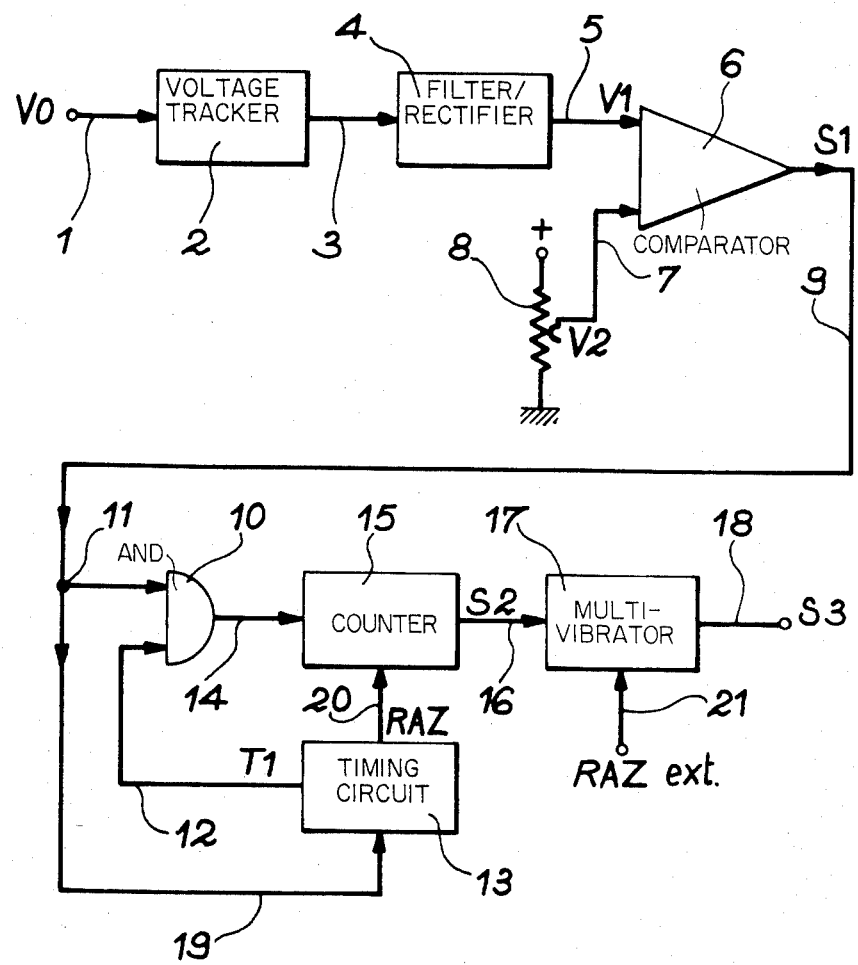
FIG. 1 is a block diagram of the principal components of the electronic detection apparatus according to the invention.

In FIG. 1, the input 1 is shown to which the direct current or alternating current electrical voltage is applied, this voltage varying as a function of time, and of which the rapid variations that may occur about its nominal value are to be monitored. In accordance with the invention, the apparatus includes a tracker 2 of the variations in this voltage, which in the present example comprises an operational amplifier of high input impedance arranged as a tracker. The tracker 2 then sends the signal via the line 3 to a device 4 which includes a filter and a rectifier, the output 5 of which is applied to the first input of a comparator 6. The second input 7 of the comparator is supplied by a source 8 reference voltage $V_2$. The operation of this first portion of the electronic apparatus which is the subject of the invention is as follows: The circuit 4 includes a bandpass filter, which suppresses the continuous component of the signal and rectifies it in accordance with either the positive or the negative alternation of the signal. The comparator 6, via its output 9, furnishes calibrated pulses each time the voltage on the line 5 exceeds the voltage threshold $V_2$.

The remainder of the diagram in FIG. 1 relates to the circuit for counting the number of these calibrated pulses which are located within a measurement time window of a given duration. To this end, it includes an AND gate 10 which at its input 11 receives the output signal of the comparator 6 which is present on the line 9, and at its input 12 receives the signal from a timing circuit 13 which constitutes the measurement time window having a duration T. The output 14 of the gate 10 is applied to a count-to-N counter 15, the output 16 of which is applied in turn to a bistable multivibrator 17, the output of which is identified by reference numeral 18.

A coupling line 19 joins the input 11 of the AND gate 10 to the circuit 13; two control lines for resetting the counter and the multivibrator to zero are also shown at 20 and 21.

The operation of this counting circuit and of the electronic detection apparatus which is the subject of the invention will now be explained, referring to FIG. 2.

In FIG. 2a, the input signal voltage $V_0$ is shown, as it is introduced via the input 1 of the tracker 2. This signal includes a signal 31 having a low-frequency mean value, which includes noise 22, parasitic oscillation signals 22a and significant phenomena 23 comprising a packet of high frequency oscillations which are to be identified.

At the output 5 of the filter and rectifier 4, the signal $V_1$ takes the course shown in FIG. 2b, where the mean low-frequency component 31 is reduced to a continuous amplitude and where the noise 22 and the significant phenomena 23 are rectified such that they are all located on the same side of the low-frequency component 31. Also shown in FIG. 2b, at 24, is the voltage threshold $V_2$ corresponding to the reference voltage above which the irregularities of the signal to be monitored are taken into consideration. At the output 9 of the comparator 6, the signals of FIG. 2c are present, for which calibrated pulses, such as 25, correspond to each instance when the threshold $V_2$ is exceeded by the input voltage that is to be monitored. In the example described herein, the significant phenomenon 23 is split up into seven peaks, which in the signal of FIG. 2c correspond to seven of these signals 25, which are labeled 1-7 in FIG. 2c.

Each time a pulse 25 appears, the timing circuit 13, which receives this information via the line 19, sends a window, in the form of a voltage step of duration T such as those seen at 26, 27 and 28 in FIG. 2d, to the input of the AND gate 10 via the line 12. The count-to-N counter 15, which in the present example is conceived of as being set such that it provides an output signal pulse 29 whenever N attains or exceeds the number of 6, releases a pulse 29 via the line 16 whenever one of the windows 26, 27 or 28 contains more than six calibrated pulses. This is precisely the case for the window 28, and the counter 15 then furnishes a pulse 29 over the line 16 which reveals the appearance of one of the significant phenomena which are to be monitored. To complete the apparatus, a multivibrator 17 then converts this pulse 29 into a change of voltage state 30 which is present at its output on the line 18 and specifically characterizes the variation in the signal was to be detected.

The electronic apparatus which has been described above makes it possible to detect the presence of a danger signal by monitoring the validity of this signal within an entity which may include various stray electrical signals. The apparatus eliminates slow drifts, background noise on the line and parasitic electricity in the signal that is to be studied.

As noted at the outset herein, an electronic apparatus of this kind is particularly advantageously applicable for detecting contact between an electrode and a surface in the field of robot welding. Nevertheless it will be understood that this application is not limiting, and that the present invention is also applicable to other fields in which there is a need to process alarms or danger signals.

What is claimed is:

1. Apparatus for detecting the presence, in an alternating electrical signal having a low frequency component and which may contain background noise and parasitic signals, of a desired signal comprising a packet of elevated frequency oscillations exceeding a predetermined number of oscillation cycles, the apparatus comprising means for filtering the electrical signal to remove therefrom the low frequency component and to diminish the parasitic signals; means for rectifying the filtered signal to convert the filtered signal to a unipolar signal; means for comparing the unipolar signal to a predetermined reference level; means for determining a number of calibrated pulses produced during a preselected period of time, the preselected period of time being sufficient for the oscillations of the desired signal to exceed said predetermined number of oscillation cycles; and means responsive to the determining means for furnishing an output signal upon the number of said calibrated pulses exceeding, within said preselected period of time, said predetermined number of oscillation cycles in order to indicate the presence of said desired signals.

2. The apparatus of claim 1, wherein said determining means comprises means for counting the number of calibrated pulses, the counting means being formed to provide said output signal upon the number of calibrated pulses exceeding said predetermined number, a timing circuit for producing a timing signal corresponding to said preselected period of time, and means responsive to the timing circuit for enabling the counting means to count the number of calibrated pulses produced during said preselected period of time.

3. The apparatus of claim 2, wherein said timing circuit is connected to said comparing means and is formed to produce said timing signal upon the comparing means producing a calibrated pulse in the absence of said timing signal, the timing circuit including means for resetting said counting means following the preselected period of time.

4. The apparatus of claim 2, wherein said enabling means comprises a gate circuit having two inputs, one of which receives said calibrated pulses from the comparing means and another of which receives the timing signal from the timing circuit, the gate circuit being formed to supply the calibrated pulses to the counting means only when the timing signal is present at said other input.

5. The apparatus of claim 2, wherein said counting means comprises a count-to-N counter, where N is said predetermined number, the counter providing an output logic signal upon the count exceeding said predetermined number, and a bistable multivibrator connected to the counter and responsive to the logic signal for changing its state to produce said output signal.

6. The apparatus of claim 1, wherein said alternating electrical signal and said desired signal are produced by a proximity sensor, the desired signal being produced upon the proximity sensor being positioned close to a part to be sensed.

7. Apparatus for detecting the proximity of a robotic member to a part, wherein a tracer element disposed on the robotic member produces, upon the robotic member being positioned in proximity to the part, a proximity signal comprising a packet of elevated frequency oscillations exceeding a predetermined number of oscillation cycles, the proximity signal being imposed upon an alternating electrical signal having a low frequency component and which may contain background noise and parasitic signals; the apparatus comprising means for filtering the proximity signal to remove the low frequency component and to diminish the parasitic signals; means for converting the filtered signal to a unipolar signals; means for comparing the unipolar signal to a predetermined reference level; means responsive to the comparing means for determining a number of times within a preselected period of time that the unipolar signal exceeds the predetermined reference level, the preselected period of time being sufficient for the oscillations of the proximity signal to exceed said predetermined number of oscillation cycles; and means responsive to the determining means for producing an output signal upon the unipolar signal exceeding the predetermined reference level within the preselected period of time by said predetermined number in order to indicate the presence of said proximity signal.

8. The apparatus of claim 7, wherein said comparing means comprises means for producing a calibrated pulse each time that the unipolar signal exceeds the predetermined reference level, said determining means comprising a gate circuit for receiving the calibrated pulses and a timing signal having a duration corresponding to said preselected period of time, the timing signal enabling the calibrated pulses to pass through the gate circuit, a counter for counting the calibrated pulses from the gate circuit, and a bistable multivibrator connected to the counter for providing said output signal, the counter being arranged to enable the bistable multivibrator to provide said output signal upon the number of calibrated pulses counted by the counter exceeding said predetermined number.

9. The apparatus of claim 8, further comprising a timing circuit connected to said comparing means for producing said timing signal upon the comparing means providing a calibrated pulse, and the timing circuit having means for resetting said counter and said bistable multivibrator following said preselected period of time.

10. A method of detecting the presence, in an alternating electrical signal having a low frequency component and which may contain background noise and parasitic signals, of a desired signal comprising a packet of elevated frequency oscillations exceeding a predetermined number of oscillation cycles, the method comprising filtering the electrical signal to remove therefrom the low frequency component and to diminish the parasitic signals; converting the filtered signal to a unipolar signal; determining a number of occurrences within a preselected period of time at which a level of the unipolar signal exceeds a predetermined reference level, the preselected period of time being sufficient for the oscillations of the desired signal to exceed said predetermined number of oscillation cycles; and furnishing an output signal to indicate the presence of said desired signal upon said number of occurrences exceeding said predetermined number of oscillation cycles.

11. The method of claim 10, wherein said determining comprises comparing the level of the unipolar signal to said predetermined reference level and producing a calibrated pulse each time the unipolar signal exceeds the predetermined reference level; counting the number of times that the unipolar signal exceeds the predetermined reference level within said preselected period of time, and providing said output signal upon said counting exceeding said predetermined number.

* * * * *